United States Patent
Siniaguine et al.

(10) Patent No.: US 6,448,153 B2
(45) Date of Patent: Sep. 10, 2002

(54) THINNING AND DICING OF SEMICONDUCTOR WAFERS USING DRY ETCH, AND OBTAINING SEMICONDUCTOR CHIPS WITH ROUNDED BOTTOM EDGES AND CORNERS

(75) Inventors: Oleg Siniaguine, San Jose; Patrick Halahan, Sunnyvale; Sergey Savastiouk, San Jose, all of CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/752,802

(22) Filed: Dec. 28, 2000

Related U.S. Application Data

(62) Division of application No. 09/491,456, filed on Jan. 26, 2000, which is a continuation-in-part of application No. 09/083,927, filed on May 22, 1998, now Pat. No. 6,184,060, which is a continuation of application No. PCT/US97/18979, filed on Oct. 27, 1997.
(60) Provisional application No. 60/030,425, filed on Oct. 29, 1996.

(51) Int. Cl.[7] .................. H01L 21/301; H01L 21/46; H01L 21/78
(52) U.S. Cl. .................. 438/460; 438/459; 438/465
(58) Field of Search ................. 438/460, 462, 438/977

(56) References Cited

U.S. PATENT DOCUMENTS

| | | | |
|---|---|---|---|
| 3,739,463 A | 6/1973 | Aird et al. ............ 29/580 |
| 3,838,501 A * | 10/1974 | Umbaugh ............ 29/583 |
| 3,991,296 A | 11/1976 | Kojima et al. ......... 219/121 L |
| 4,729,971 A * | 3/1988 | Coleman ............ 437/226 |
| 4,822,755 A * | 4/1989 | Hawkins et al. ....... 437/227 |
| 4,978,639 A * | 12/1990 | Hua et al. ............ 437/230 |
| 5,024,970 A * | 6/1991 | Mori ................. 437/226 |
| 5,259,924 A | 11/1993 | Mathews et al. ....... 156/653 |
| 5,322,816 A | 6/1994 | Pinter ................ 438/667 |
| 5,627,106 A | 5/1997 | Hsu .................. 438/438 |
| 5,656,553 A | 8/1997 | Leas et al. ........... 438/15 |
| 5,691,248 A * | 11/1997 | Cronin et al. ......... 437/227 |
| 5,707,485 A * | 1/1998 | Rolfson et al. ........ 156/643 |
| 5,851,845 A * | 12/1998 | Wood et al. .......... 438/15 |
| 5,979,475 A * | 11/1999 | Satoh et al. .......... 134/140 |
| 6,004,867 A | 12/1999 | Kim et al. ........... 438/459 |
| 6,121,119 A * | 9/2000 | Richards et al. ....... 438/462 |
| 6,162,701 A | 12/2000 | Usami et al. ......... 438/455 |
| 6,176,966 B1 | 1/2001 | Tsujimoto et al. ...... 156/344 |

* cited by examiner

Primary Examiner—John F. Niebling
Assistant Examiner—Angel Roman
(74) Attorney, Agent, or Firm—Skjerven Morrill LLP; Michael Shenker

(57) ABSTRACT

A semiconductor wafer is diced before thinning. The wafer is diced only part of the way through, to form grooves which are at least as deep as the final thickness of each chip to be obtained from the wafer. Then, the wafer is placed into a non-contact wafer holder, and the wafer backside is blanket etched with a dry etch, for example, atmospheric pressure plasma etch. The wafer is thinned until the grooves are exposed from the backside. The dry etch leaves the chip's backside smooth. After the grooves have been exposed, the dry etch is continued to remove damage from the chip sidewalls and to round the chips' bottom edges and coners. As a result, the chip becomes more reliable, and in particular more resistant to thermal and other stresses.

28 Claims, 8 Drawing Sheets

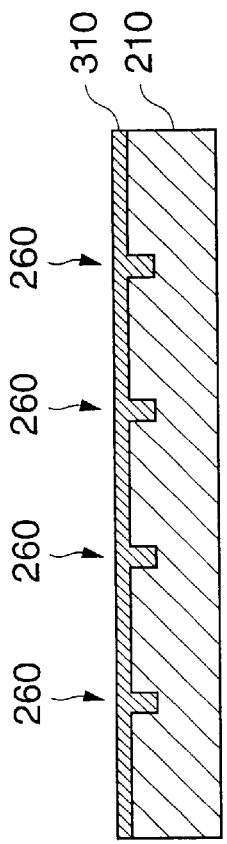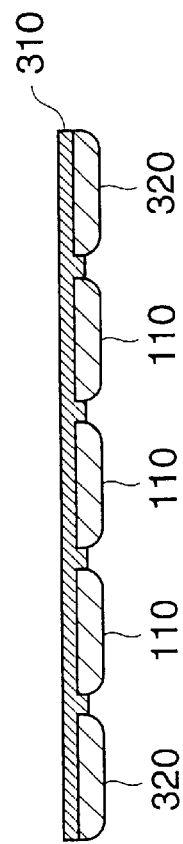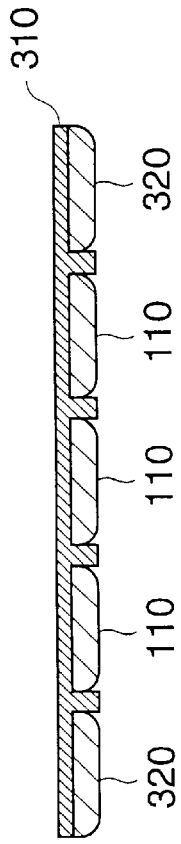

THINNING AND DICING OF SEMICONDUCTOR WAFERS USING DRY ETCH, AND OBTAINING SEMICONDUCTOR CHIPS WITH ROUNDED BOTTOM EDGES AND CORNERS

CROSS REFERENCE TO RELATED APPLICATIONS

The present application is a division of U.S. patent application Ser. No. 09/491,456, filed Jan. 26, 2000, which is a continuation-in-part of U.S. patent application Ser. No. 09/083,927 filed May 22, 1998, now U.S. Pat. No. 6,184,060 incorporated herein by reference, which is a continuation of PCT application PCT/US97/18979 (WO 98/19337), having an international filing date of Oct. 27, 1997, incorporated herein by reference, which claims priority of U.S. provisional application 60/030,425 filed Oct. 29, 1996, incorporated herein by reference.

BACKGROUND OF THE INVENTION

The present invention relates to thinning and dicing of semiconductor wafers using a dry etch.

In many semiconductor fabrication processes, when circuitry has been fabricated in a semiconductor wafer, the wafer is thinned and then diced into chips. The thinning is typically performed with mechanical lapping. Dicing is performed with a diamond saw or a laser. The diamond saw or the laser can be used to cut the wafer all the way through along scribe lines. Alternatively, the wafer is cut part of the way through, and then broken.

The thinning and dicing processes can damage the wafer. It is desirable to provide alternative processes that reduce wafer damage and prolong the lifetime of hips obtained from the wafer.

SUMMARY

Some embodiments of the present invention reduce or eliminate wafer damage and prolong the chip lifetime by dicing the wafer part of the way through and then thinning the wafer with a dry etch. The chip lifetime is prolonged because the dry etch removes damage from chip surfaces and rounds the chip's edges and coners.

More particularly, as illustrated in FIG. 1, a chip 110 obtained by prior art thinning and dicing techniques may have uneven, damaged surfaces 110B, 110S, with sharp bottom coners and edges. Surface 110B is the chip's backside, and surfaces 110S are sidewalls. The wafer has been thinned from backside 110B by mechanical lapping, and then diced along sidewalls 110S with a diamond saw or a laser apparatus. These thinning and dicing processes damage the backside 110B and sidewalls 110S. The damage may include chipped, jagged surfaces, and microcracks. When the chip 110 is later packaged and put into use, the chip is subjected to heating and cooling cycles. These cycles cause the chip's packaging material (not shown) to exert stresses on the chip. Additional stresses can be developed inside the chip due to the thermal cycles, chip handling, or the presence of different materials or other non-uniformities inside the chip. Because the chip surfaces 110B, 110S are damaged, and because they intersect at sharp edges and coners, the stresses concentrate at isolated points on the chip surface. Further, microcracks weaken the chip's resistance to stress. As a result, the chip becomes less reliable. Cracks formed or extended by stresses in the chip can reach and damage the chip circuitry (not shown).

Dry etch provides smoother chip surfaces and rounded edges and corners. Damage is reduced or eliminated. The chip reliability is therefore improved.

In some embodiments of the present invention, the wafer is processed as follows. The wafer is diced to form grooves in the face side of the wafer. The grooves are at least as deep as the final thickness of each chip to be obtained from the wafer. Dicing can be performed with a diamond saw or a laser. The grooves' sidewalls can be damaged.

Then the wafer is placed into a non-contact wafer holder, and the wafer backside is etched with the dry etch until the grooves are exposed from the backside. The dry etch leaves the chips' backside smooth. In some embodiments, the dry etch continues after the grooves have been exposed from the backside. The etchant gets into the grooves and smoothens the chip sidewalls, removing at least some of the sidewall damage. The etchant also rounds the bottom coners and edges of the chips.

Suitable etches include atmospheric pressure plasma etches described, for example, in the aforementioned U.S. patent application Ser. No. 09/083,927. These etches are fairly fast. Silicon can be etched at 10 µm/min.

In some embodiments, the dry etch is a blanket uniform etch of the wafer's flat backside surface. No masking layers are used on the backside surface.

The invention is not limited to the embodiments described above. In some embodiments, one or more openings are formed in a first surface of a semiconductor wafer along a boundary of one or more chips. The openings do not go through the wafer. The wafer is placed into a non-contact wafer holder and thinned with a dry etch until the openings are exposed on a second side.

Other features of the invention are described below. The invention is defined by the appended claims.

BRIEF DESCRIPTION OF THE DRAWINGS

FIGS. 7 through 11 are cross-section illustrations of wafers being processed according to embodiments of the present invention.

DESCRIPTION OF SOME EMBODIMENTS

Figure 1:
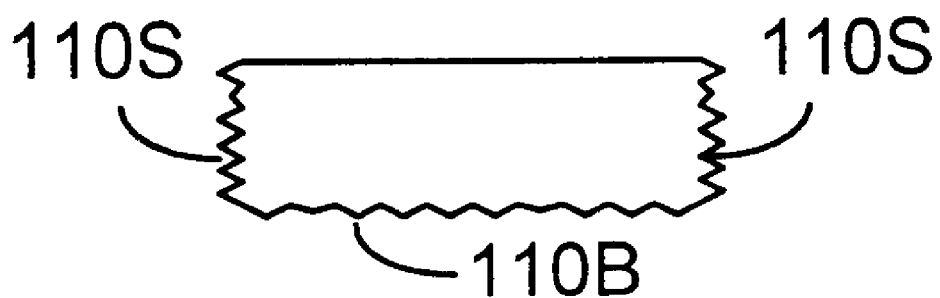
FIG. 1 is a side view of a prior art semiconductor chip.
Figure 2A:
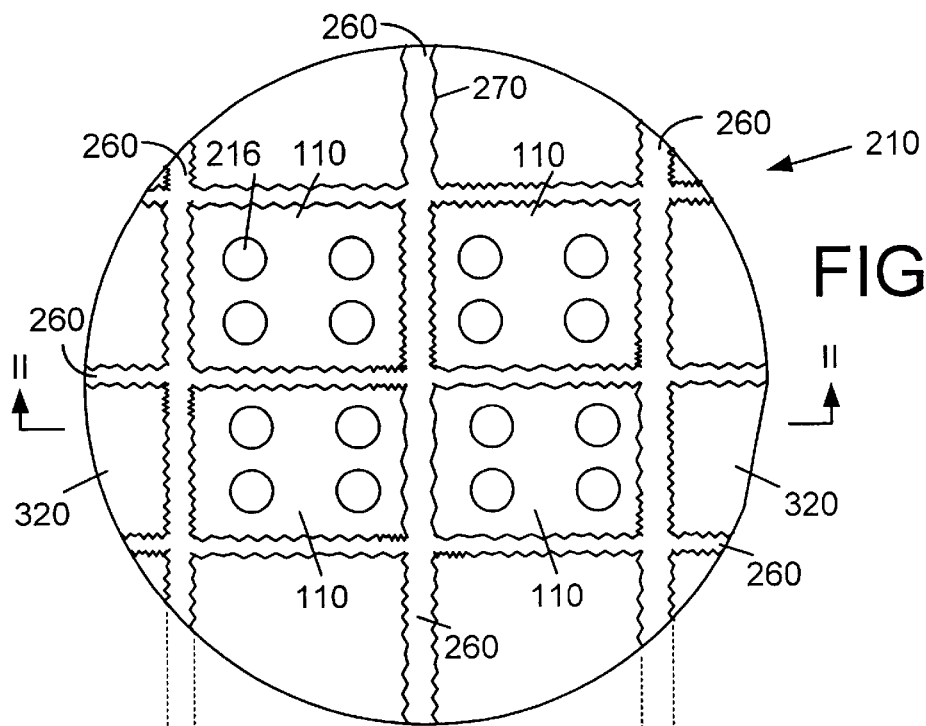
FIG. 2A is a top view of a wafer being processed according to an embodiment of the present invention.
Figure 2B:
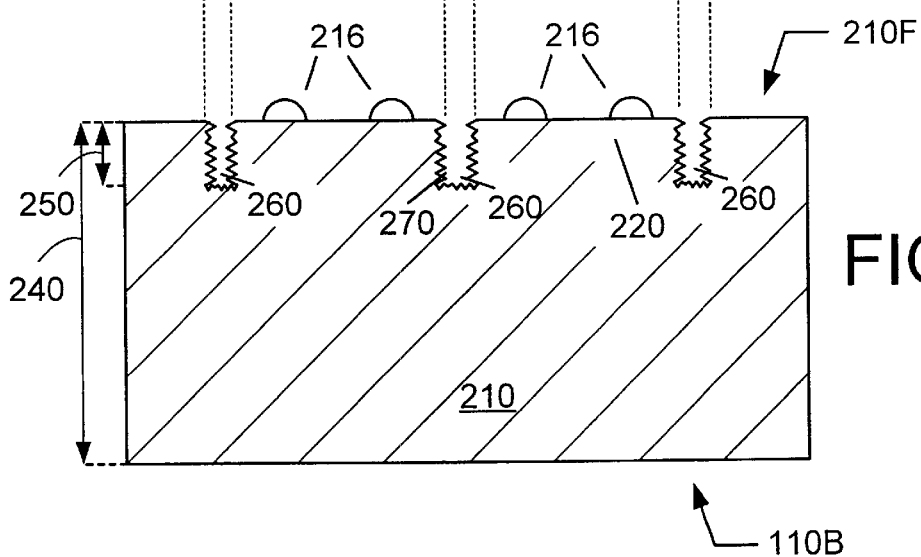
FIG. 2B shows a cross-section of the wafer of FIG. 2A along the lines II—II.

FIG. 2A is a top view of a semiconductor wafer 210 shown before the wafer is thinned with a dry etch. FIG. 2B is a cross sectional view of the wafer along the lines II—II in FIG. 2A. Circuitry has been fabricated in the wafer, and the wafer must now be divided into chips 110. The circuitry may include transistors, diodes, and other devices (not shown) manufactured in and over an active layer 220 (FIG. 2B) adjacent to the wafer top surface 210F (the surface shown in FIG. 2A). Optional conductive bumps 216 have been manufactured on contact pads on top surface 210F of chips 110. The bumps will be used to connect the chips to wiring substrates (not shown), e.g., printed circuit boards.

The wafer thickness 240 has been sufficiently large to achieve suitable mechanical strength and heat dissipation during fabrication of the wafer circuitry. 720 µm is suitable for some silicon wafer fabrication processes. The wafer will now to be thinned to its final thickness 250. In some embodiments, the final thickness is 10–450 µm. These thickness figures are illustrative and not limiting.

After the circuitry and the bumps 216 were manufactured, grooves 260 were formed in the wafer top surface along scribe lines and, in particular, along the boundary of chips 110. The grooves could be formed by conventional dicing techniques, e.g. with a diamond saw or a laser. Other processes, e.g., a masked etch, could also be used. The grooves do not go through the wafer. The grooves are at least as deep as the final chip thickness 250. In some embodiments, the groove depth is 10–450 µm. The grooves will be exposed from the bottom during wafer thinning when the wafer back side 110B is etched, as described below.

The groove sidewall and bottom surfaces 270 can be damaged by dicing, as schematically shown by uneven lines in FIGS. 2A, 2B.

Figure 3:
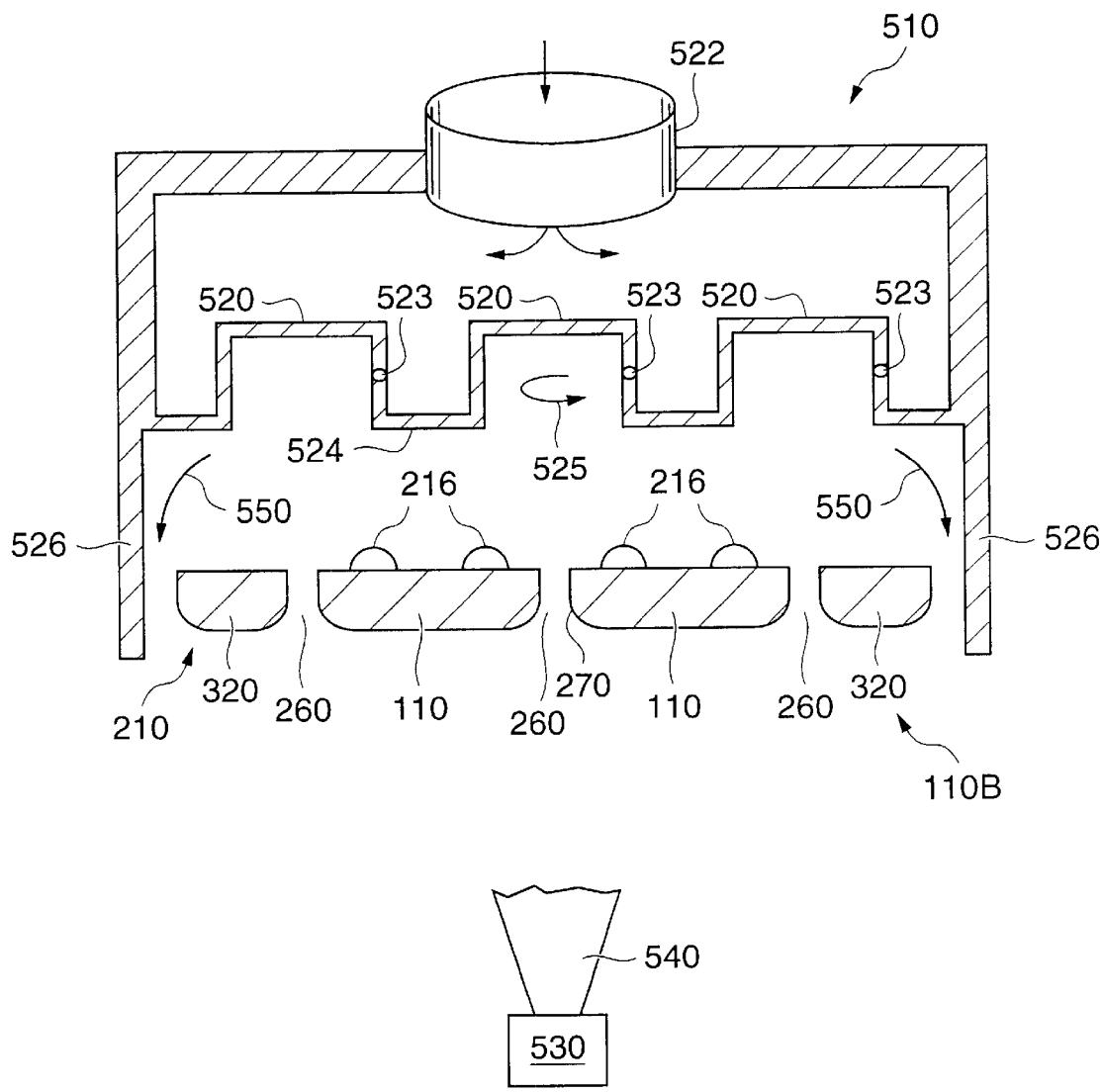
FIGS. 3 and 4 are cross-sections illustration of a wafer and processing equipment during wafer thinning according to an embodiment of the present invention.

Wafer 210 is placed in a non-contact wafer holder 510 (FIG. 3). Holder 510 includes one or more vortex chucks 520 having outlets in the holder's surface 524. Surface 524 faces the top surface of the wafer. Gas supplied under pressure through a conduit 522 enter chucks 520 through respective passages 523. Each passage is tangential to the chuck's cylindrical chamber when viewed from the top. A gas vortex 525 emitted by each chuck towards the wafer generates a low pressure zone near the chuck's vertical axis. In this zone, the wafer is drawn towards the chuck. At the same time, the gas vortices do not allow the wafer to touch the holder surface 524. Such wafer holders are described, for example, in U.S. patent application Ser. No. 09/456,135 "Non-Contact Workpiece Holder" filed by O. Siniaguine et al. on Dec. 7, 1999 and incorporated herein by reference. Other suitable holders are described in PCT publication WO 99/46805 (TruSi Technologies, LLC, Sep. 16, 1999) incorporated herein by reference. Other holders, for example, Bernoulli type holders, can also be used.

Wafer holder 510 is called "non-contact" because the top surface of the wafer does not contact the holder surface 524. However, the edge of the wafer can contact the holder's limitors 526 which extend around the wafer to restrict the wafer lateral motion. In some embodiments, holder 510 is mounted on a rotating carousel (not shown). The carousel rotation develops a centrifugal force that presses the wafer against one or more limitors 526. See PCT publication WO 99/26796 (TruSi Technologies, LLC, Jun. 3, 1999).

The wafer backside surface 110B is etched with a dry etch. In FIG. 3, the etch is a blanket (unmasked) uniform etch of the wafer's flat semiconductor backside surface (e.g., silicon surface). The etch is atmospheric pressure plasma etch. Plasma generator 530 generates plasma 540 into which suitable reagents are injected. If the wafer is made of silicon, a CF4 etch can be used. See PCT publication WO 98/19337 (TruSi Technologies, LLC, May 7, 1998) incorporated herein by reference. A suitable etcher is type Tru-Etch 3000 (trademark) available from TruSi Technologies, LLC, of Sunnyvale, Calif. The dry etch thins the wafer until the grooves 260 are exposed from the bottom. When the grooves are exposed, the plasma enters the grooves and etches the groove sidewalls 270. The sidewalls become smoother as a result. The dicing damage becomes partially or completely removed from the sidewalls. The bottom coners and edges of chips 110 become rounded.

Advantageously, some atmospheric pressure plasma etching processes described in WO 98/19337 are fast. Silicon can be etched at the rate of about 10 µm/min. Other kinds of etches can also be used. The dry etch can be preceded by mechanical lapping of the wafer bottom surface 110B.

In some embodiments, before the backside etch, the groove depth 250 (FIG. 2) exceeds the final chip thickness by an amount needed to obtain the rounded edges and coners and smooth sidewalls for chips 110. The more the groove depth exceeds the final chip thickness, the longer the duration of the backside etch after the grooves have been exposed from the bottom. The bottom coners and edges become more rounded, and more time is allowed for sidewall damage removal. In some embodiments, the radius of the rounded coners is roughly 1.5 times the thickness of the material removed from the wafer backside after the grooves are exposed. The depth of the grooves also takes into account possible wafer non-uniformity, the non-uniformity of the dicing process that creates the grooves, and the non-uniformity of the backside etch. If mechanical lapping or any other process is used to remove material from the wafer backside before the dry etch illustrated in FIG. 5, the non-uniformity of such process can also be taken into account. In some embodiments, the groove depth 250 exceeds the final chip thickness by 10 µm or more.

Figure 4:
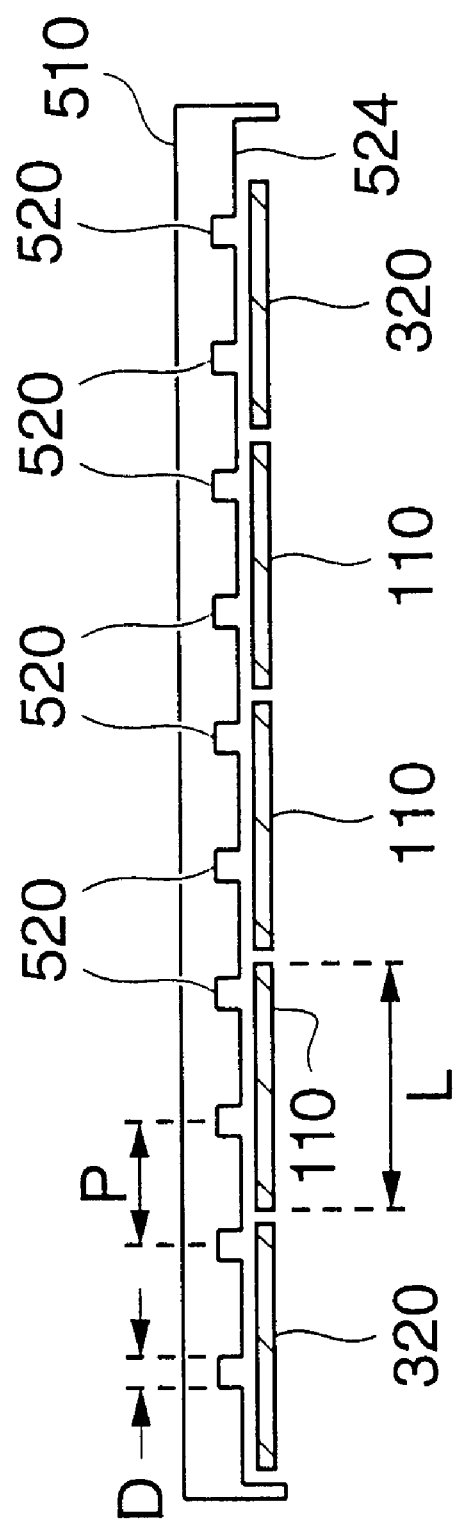

When the grooves 260 become exposed during the thinning etch of FIG. 3, chips 110 become separated from each other, but the chips are held in holder 510 by the vacuum forces developed by the gas vortices. The vortex chucks 520 are positioned close to each other to insure that each chip 110 will be adjacent to a low pressure zone developed by at least one chuck 520. In FIG. 4, "L" denotes the greatest lateral dimension of each chip 110. "P" is the distance between the centers of the adjacent chucks 520. "D" is the diameter of each chuck. "P" and "D" can vary for different chucks 520 in the same wafer holder. The diameter D of each vortex chuck should be small enough to prevent a chip from being sucked into the chuck. The chip should be balanced at a predetermined distance from the wafer holder surface 524 by the vacuum forces drawing the chip towards the holder and the opposite-direction forces generated between the chucks by the gas flowing away from the chucks. In some embodiments, D<L/2 and P<L/2 for all the chucks.

In some embodiments, each of P and D is less than one half of the shortest side of each rectangular chip 110.

In some embodiments, the distance between the adjacent chucks and the diameter of each chuck take into account the peripheral wafer portions 320 (FIG. 2A). Each of P and D is less than one half of the greatest lateral dimension, or of the longest or shortest side, of each portion 320.

Figure 5:
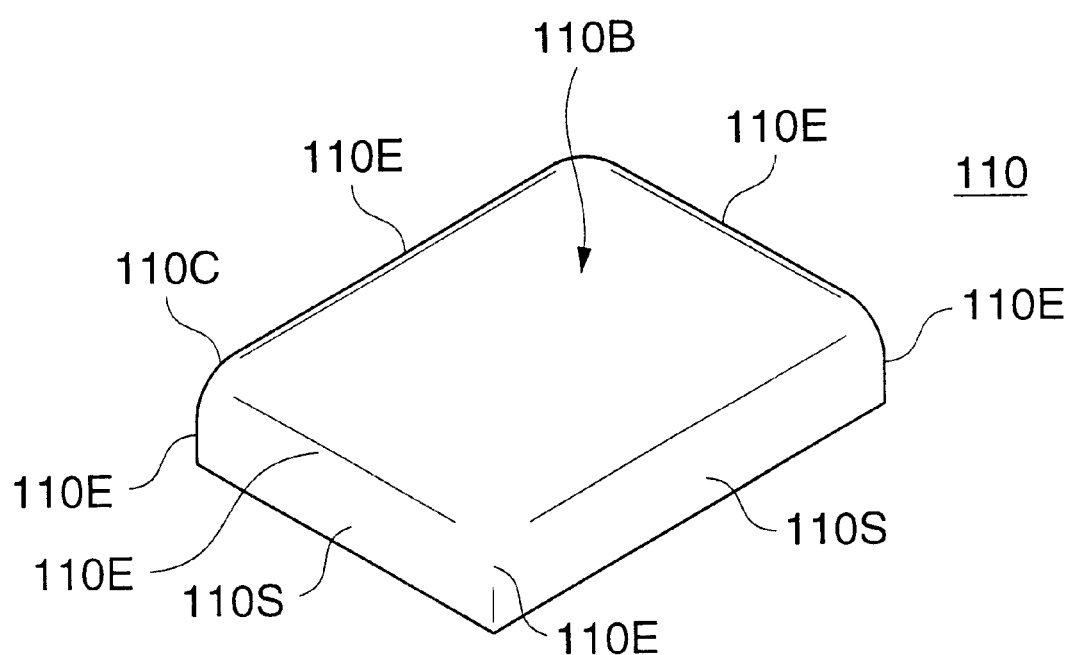
FIG. 5 is a perspective view of a chip processed according to an embodiment of the present invention.

FIG. 5 is a perspective view of a chip 110 after the etch. The chip is shown bottom side up. The chip's sidewalls 110S and bottom surface 110B are smooth. The edges 110E at which the sidewalls 110S meet with each other and with the bottom surface 110B are rounded, and so are the bottom corners 110C. The smooth surfaces and the rounded edges and coners prolong the chip's lifetime and improve the chip's reliability.

Figure 6:
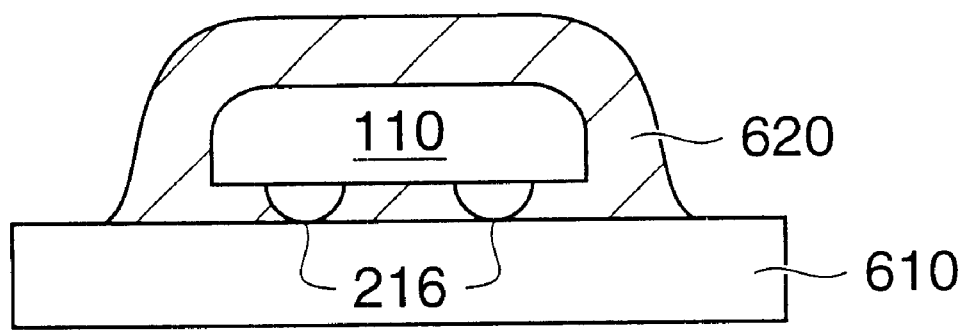
FIG. 6 is a side view of a packaged chip processed according to an embodiment of the present invention.

In FIG. 6, chip 110 has been mounted on a printed circuit board 610 using flip chip technology. Bumps 216 are soldered to the printed circuit board. Encapsulant 620 (suitable plastic) is deposited over the chip for protective purposes. The chip's smooth surfaces and rounded edges and corners prolong the chip's lifetime. Similar advantages are achieved with non-flip-chip packaging.

Figure 7:
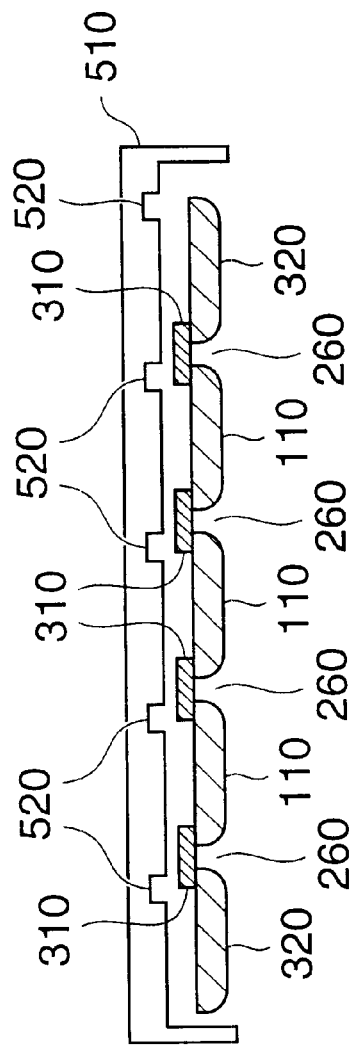

In FIG. 7, the etch uniformity is improved by depositing a layer 310 over grooves 260 and wafer portions adjacent to the grooves. Layer 310 is deposited before the backside etch of the wafer. When chips 110 and peripheral portions 320 become separated during the backside etch, the layer 310 holds the chips and the portions 320 in the same position relative to each other. Therefore, the gaps between the chips 110 and the peripheral portions 320 remain uniform, and hence the chip sidewalls (the sidewalls of grooves 260) are etched uniformly. If some chips 110 were too close to each other or to peripheral portions 320, the chips' sidewalls could be etched too slowly, and less damage would be removed than desirable. Other sidewalls, farther from adjacent chips 110 or portions 320, could be undesirably overetched.

Layer 310 also relaxes the requirements for the distance between adjacent vortex chucks 520 and the diameter of each chuck since the chips 110 and peripheral portions 320 are held in position by layer 310 throughout the backside etch.

Layer 310 can be a sticky material which adheres to the wafer without additional adhesive. Alternatively, adhesives can be used. In some embodiments, layer 310 is polyimide. Polyimide is chosen because it does not react with etchants utilized in some thinning processes (e.g., CF4). The thickness of polyimide layer 310 is 1 μm to 200 μm in some embodiments. Other materials and thicknesses can also be used. In some embodiments, layer 310 is an adhesive tape such as described in U.S. Pat. No. 5,888,883 issued on Mar. 30, 1999 to Sasaki et al.

Layer 310 does not cover the middle portions of chips 110, including the bumps 216. The bumps, and any other uneven features of the chip top surface 210F, are believed to be capable of impeding adhesion of layer 310 to the wafer.

In some embodiments, layer 310 is pre-manufactured as a continuous sheet. Then openings are cut out in layer 310 at the location of the middle portions of chips 110. Then layer 310 is deposited.

Layer 310 can be deposited using known techniques. In some embodiments, layer 310 is deposited at atmospheric pressure using a roller to remove air bubbles. Alternatively, layer 310 can be laminated on the wafer in vacuum, with or without a roller.

Figure 8:
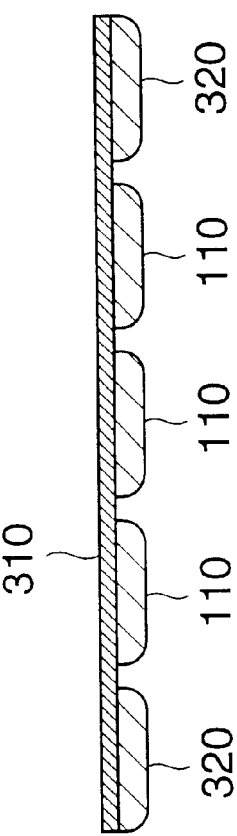

In some embodiments, layer 310 covers peripheral portions 320. In FIG. 8, layer 310 covers the entire wafer. In some embodiments, the top surface of chips 110 is even, bumps 216 are absent.

The invention is not limited to layer 310 covering or exposing any particular features of the wafer.

Layer 310 prevents the plasma from going through the grooves 260 and damaging the circuitry at the top surface of the wafer. Gas emitted by chucks 520 flows down around the wafer as shown at 550 in FIG. 3, and impedes the plasma from flowing up around the wafer and reaching the wafer top surface. As indicated in the aforementioned U.S. patent application Ser. No. 09/456,135, the chuck density can be made high at the edge of wafer holder 510 to prevent the plasma from flowing up around the wafer. Gas can be made to flow down at all points around the wafer.

In FIG. 9, layer 310 has been deposited by a spin-on or spraying technique. Layer 310 fills grooves 260. (In contrast, in FIGS. 7 and 8, the grooves are not filled.) Layer 310 in FIG. 9 can be polymer or some other material.

FIG. 10 shows the structure after the backside etch for FIG. 9. In the embodiment of FIG. 10, when layer 310 is exposed from the bottom, layer 310 is etched faster than the wafer substrate. Therefore, the bottom surface of layer 310 is higher than the bottom surface of chips 110 and peripheral portions 320. The bottom coners and edges of chips 110 have been exposed to the etchant, and have been rounded.

FIG. 11 illustrates an embodiment in which the layer 310 is etched slower than the wafer substrate. This is the case if layer 310 is polyimide, the wafer is a silicon wafer, and the etch is a CF4 plasma etch. Layer 310 is etched slowly, but the microloading effect causes the chips 110 to be etched faster at the bottom edges adjacent to layer 310. As a result, the bottom edges and coners of chips 110 are rounded.

After the etch of FIGS. 10 or 11, layer 310 is removed. In some embodiments, polyimide layer 310 is removed by oxygen plasma.

The above embodiments illustrate but do not limit the invention. The invention is not limited to silicon wafers or any packaging technology. The invention is not limited to plasma etching, or to any particular etch chemistry or type of etcher. The invention is not limited to wafers containing multiple chips. In some embodiments, only one chip has been fabricated in the wafer. The chip is extracted and the wafer peripheral portions 320 are discarded. The invention is not limited to unmasked or uniform backside etches. Other embodiments and variations are within the scope of the invention, as defined by the appended claims.

What is claimed is:

1. A method for obtaining one or more chips from a semiconductor wafer, the method comprising:
    forming one or more openings in a first side of the semiconductor wafer along a boundary of the one or more chips, wherein the one or more openings do not go through the wafer; and
    placing the wafer into a non-contact wafer holder and thinning the wafer with a dry etch to remove material from an entire second side of the wafer at least until the one or more openings become exposed on the second side, wherein the dry etch rounds one or more of the edges and/or coners obtained on the second side of the wafer at a location of the one or more openings when the one or more openings become exposed.

2. The method of claim 1 wherein the one or more openings comprise a groove extending along the entire boundary of at least one chip.

3. The method of claim 2 wherein the wafer holder comprises one or more vortex chucks each of which emits a gas vortex towards the wafer to hold the wafer in the holder.

4. The method of claim 2 further comprising, after forming the one or more openings but before thinning the wafer, attaching the first side of the wafer to a layer which remains on the wafer while the wafer is thinned.

5. The method of claim 2 further comprising, after forming the one or more openings, forming a protective layer on the first side over the one or more openings, the protective layer protecting the first side of the wafer during the dry etch from an etchant penetrating through the one or more openings from the second side and damaging the first side when the one or more openings become exposed on the second side.

6. The method of claim 5 wherein the layer does not cover the entire first side of the wafer.

7. The method of claim 5 wherein the layer covers the entire first side of the wafer.

8. The method of claim 2 wherein the dry etch comprises an atmospheric pressure plasma etch.

9. The method of claim 2 wherein after the groove is exposed from the second side, the dry etch continues and smoothens the groove's sidewall.

10. The method of claim 2 wherein the semiconductor wafer comprises circuitry made at the first side of the wafer, the second side is a backside opposite to the first side, and the groove is formed along a scribe line on the first side.

11. The method of claim 2 wherein the groove is formed with a diamond saw or a laser.

12. The method of claim 1 wherein the dry etch rounds all of the edges and coners on the second side of each semiconductor chip obtained from the wafer in the dry etch.

13. The method of claim 2 wherein from a start of the thinning operation until the groove is exposed, the dry etch etches the second side of the wafer uniformly.

14. The method of claim 2 wherein the entire dry etch is an unmasked etch of the second side.

15. The method of claim 2 wherein the dry etch results in the chip being separated from the rest of the wafer.

16. A method for obtaining one or more chips from a semiconductor wafer, the method comprising:

forming one or more openings in a first side of the semiconductor wafer along a boundary of the one or more chips, wherein the one or more openings do not go through the wafer; and thinning the wafer with a dry etch to remove material from an entire second side of the wafer at least until a through hole is formed at a location of each of the one or more openings, wherein the dry etch rounds one or more of the edges and/or coners obtained on the second side of the wafer during the etch at a location of the one or more through holes.

17. The method of claim 16 wherein throughout the dry etch the wafer is held in a non-contact wafer holder.

18. The method of claim 16 wherein the one or more openings comprise a groove extending along the entire boundary of at least one chip, and the dry etch results in the chip being separated from the rest of the wafer.

19. The method of claim 16 wherein the dry etch continues after the through hole is formed at the location of each of the one or more openings.

20. A method for obtaining one or more chips from a semiconductor wafer, the method comprising:

forming one or more openings in a first side of the semiconductor wafer along a boundary of the one or more chips, wherein the one or more openings do not go through the wafer; and thinning the wafer with a dry etch to remove material from an entire second side of the wafer at least until a semiconductor sidewall of at least the one or more openings is exposed on the second side, such that at some time during the dry etch, the semiconductor sidewall has a portion spaced from the second side but reachable from the second side through the opening.

21. The method of claim 20 wherein throughout the dry etch the wafer is held in a non-contact wafer holder.

22. The method of claim 20 wherein the one or more openings comprise a groove extending along the entire boundary of at least one chip, and the dry etch results in the chip being separated from the rest of the wafer.

23. A method for obtaining one or more chips from a semiconductor wafer, the method comprising:

forming one or more openings in a first side of the semiconductor wafer along a boundary of the one or more chips, wherein the one or more openings do not go through the wafer; and etching an entire second side of the wafer with a dry etch at least until the one or more openings become exposed on the second side, wherein the dry etch rounds one or more of the edges and/or coners obtained on the second side of the wafer at a location of the one or more openings when the one or more openings become exposed.

24. The method of claim 23 wherein the one or more openings comprise a groove extending along the entire boundary of at least one chip.

25. The method of claim 24 wherein after the groove is exposed from the second side, the dry etch continues and smoothens the groove's sidewall.

26. The method of claim 24 wherein the semiconductor wafer comprises circuitry made at the first side of the wafer, the second side is a backside opposite to the first side, and the groove is formed along a scribe line on the first side.

27. The method of claim 23 wherein the dry etch rounds all of the edges and corners on the second side of each semiconductor chip obtained from the wafer in the dry etch.

28. The method of claim 23 wherein the dry etch results in the chip being separated from the rest of the wafer.

* * * * *